(12) United States Patent
Neji et al.

(10) Patent No.: US 10,578,698 B2
(45) Date of Patent: Mar. 3, 2020

(54) METHOD AND APPARATUS FOR ACQUIRING MAGNETIC RESONANCE IMAGE DATA

(71) Applicant: Siemens Aktiengesellschaft, Munich (DE)

(72) Inventors: Radhouene Neji, London (GB); David Andrew Porter, Regensburg (DE)

(73) Assignee: Siemens Healthcare GmbH, Erlangen (DE)

( * ) Notice: Subject to any disclaimer, the term of this patent is extended or adjusted under 35 U.S.C. 154(b) by 764 days.

(21) Appl. No.: 14/959,047

(22) Filed: Dec. 4, 2015

(65) Prior Publication Data

US 2016/0161582 A1    Jun. 9, 2016

(30) Foreign Application Priority Data

Dec. 5, 2014  (DE) .......................... 10 2014 225 006

(51) Int. Cl.
  *G01R 33/56*    (2006.01)
  *G01R 33/483*   (2006.01)
(52) U.S. Cl.
  CPC ..... *G01R 33/5602* (2013.01); *G01R 33/4838* (2013.01); *G01R 33/5607* (2013.01)
(58) Field of Classification Search
  CPC ............ G01R 33/5602; G01R 33/5607; G01R 33/4838; G01R 33/4833; G01R 33/4835
  See application file for complete search history.

(56) References Cited

U.S. PATENT DOCUMENTS

| 5,233,991 | A | 8/1993 | Wright | |
|---|---|---|---|---|
| 6,564,080 | B1* | 5/2003 | Kimura | A61B 5/0263 324/307 |
| 2002/0115929 | A1* | 8/2002 | Machida | A61B 5/055 600/410 |
| 2004/0181146 | A1* | 9/2004 | Yarnykh | A61B 5/055 600/419 |
| 2010/0013479 | A1 | 1/2010 | Park | |
| 2011/0144474 | A1 | 6/2011 | Ouwerkerk | |
| 2014/0062474 | A1 | 3/2014 | Zhou et al. | |

(Continued)

FOREIGN PATENT DOCUMENTS

DE    4232883 C2    4/1995

OTHER PUBLICATIONS

Tannus et al., "Adiabatic Pulses," NMR in Biomedicine, vol. 10, pp. 423-434 (1997).

(Continued)

*Primary Examiner* — Son T Le
*Assistant Examiner* — Dustin R Dickinson
(74) *Attorney, Agent, or Firm* — Schiff Hardin LLP

(57) ABSTRACT

In a method and apparatus for acquiring magnetic resonance image data, improved preparation of nuclear spins is achieved by radiating at least one inversion pulse, which acts site-selectively on at least one inversion pulse range, with the at least one inversion pulse range being situated at least partially outside the area under examination, radiation of at least one excitation pulse, read-out of magnetic resonance signals from the area under examination, and reconstruction of magnetic resonance image data from the read-out magnetic resonance signals, the magnetic resonance image data depicting the area under examination.

13 Claims, 2 Drawing Sheets

(56) References Cited

U.S. PATENT DOCUMENTS

| | | | | |
|---|---|---|---|---|
| 2014/0200435 A1* | 7/2014 | Edelman | ............... | A61B 5/055 600/410 |
| 2015/0223703 A1* | 8/2015 | Abd-Elmoniem | ... | A61B 5/7207 600/413 |
| 2015/0323630 A1* | 11/2015 | Weingartner | ........ | G01R 33/543 324/309 |

OTHER PUBLICATIONS

Bydder et al., "MR Imaging: Clinical Use of the Inversion Recovery Sequence," Journal of Computer Assisted Tomography, vol. 9, No. 4, pp. 659-675 (1985).

Feinberg et al., "Inner Volume MR Imaging: Technical Concepts and Their Application," Radiology, vol. 156, pp. 743-747 (1985).

Hardy et al., "Spatial Localization in Two Dimensions Using NMR Designer Pulses," Journal of Magnetic Resonance, vol. 82, pp. 647-654 (1989).

Bottomley, "Spatial Localization in NMR Spectroscopy in Vivo," Ann N Y Acd Sci;NR. 508, pp. 333-348 (1987).

Haase et al., "1H NMR chemical shift selective (CHESS) imaging," Phys Med Biol, vol. 30, No. 4, pp. 341-344 (1985).

Kaldoudi et al., "A Chemical Shift Selective Inversion Recovery Sequence for Fat-Suppressed MRI: Theory and Experimental Validation," Magnetic Resonance Imaging, vol. 11, pp. 341-355 (1993).

Nagy et al., "Efficient Fat Suppression by Slice-Selection Gradient Reversal in Twice-Refocused Diffusion Encoding," Magnetic Resonance in Medicine, vol. 60, pp. 1256-1260 (2008).

Saritas et al., "DWI of the Spinal Cord with Reduced FOV Single-Shot EPI," Magnetic Resonance in Medicine, vol. 60, pp. 468-473 (2008).

Feinberg et al., "Zoomed Resolution in Simultaneous Multi-slice EPI for fMRI," Proc. Intl. Soc. Mag. Reson. Med., vol. 21, p. 3316 (2013).

Harms et al., "MR Imaging of the Breast with Rotating Delivery of Excitation Off Resonance: Clinical Experience with Pathologic Correlation," Radiology, vol. 187, pp. 493-501 (1993).

Connelly et al., "Outer Volume Suppressed Image Related in Vivo Spectroscopy (OSIRIS), a High-Sensitivity Localization Technique," Journal of Magnetic Resonance, vol. 78, pp. 519-525 (1988).

Goelman et al., "Multiband Adiabatic Inversion Pulses," Journal of Magnetic Resonance, Series A, No. 101, pp. 136-146 (1993).

Taviani V, et.al.: "Reduced Field of View Diffusion-Weighted Imaging of the Thyroid Gland Using 2D RF Pulses and Optimal B1 Reconstruction", in: Proc. Intl. Soc. Mag. Reson. Med., vol. 20, p. 2313; 2012.

German Office Action dated Dec. 8, 2015, for Application No. 10 2014 225 006.4.

* cited by examiner

METHOD AND APPARATUS FOR ACQUIRING MAGNETIC RESONANCE IMAGE DATA

BACKGROUND OF THE INVENTION

Field of the Invention

The present invention concerns a method for acquiring magnetic resonance image data, and a magnetic resonance apparatus and a non-transitory, computer-readable data storage medium for implementing such a method.

Description of the Prior Art

In a magnetic resonance apparatus, also called a magnetic resonance tomography system, the body to be examined of a person under examination, in particular a patient, is conventionally exposed to a relatively high basic magnetic field, for example of 1.5 or 3 or 7 tesla with the use of a basic field magnet in a scanner. In addition, gradient switchings are produced by the operation of gradient coil unit. Radio-frequency pulses, for example excitation pulses, are then emitted by a radio-frequency antenna unit by the operation of suitable antenna systems, which cause the nuclear spins of specific atoms resonantly excited by these radio-frequency pulses to be tilted by a defined flip angle with respect to the magnetic field lines of the basic magnetic field. Upon relaxation of the nuclear spins, radio-frequency signals, so-called magnetic resonance signals, are emitted, which are received by suitable radio-frequency antennas and then processed further. Finally, the desired image data can be reconstructed from the raw data acquired in this way.

For a specified measurement (data acquisition), therefore, a specific magnetic resonance sequence, also called a pulse sequence, is emitted, which is composed of a sequence of radio-frequency pulses, for example excitation pulses, preparation pulses and refocusing pulses and, at compatible times, gradient fields are emitted in different gradient axes in different spatial directions. Readout windows are set coordinated therewith in terms of time, and these specify the time frames in which the induced magnetic resonance signals are acquired. The preparation pulses may be inversion pulses, which are typically designed for suitable preparation of the relevant nuclear spins.

SUMMARY OF THE INVENTION

An object of the invention is to enable improved preparation of nuclear spins for acquiring magnetic resonance image data.

This object is achieved according to the invention by a method for acquiring magnetic resonance image data from an area under examination of an object under examination that includes the steps of radiation of at least one inversion pulse, which acts site-selectively (spatially selectively) on nuclear spins within at least one effective range of the inversion pulse (inversion pulse range), wherein the at least one inversion pulse range is situated at least partially outside the area under examination, radiation of at least one excitation pulse, read-out of magnetic resonance signals (raw data) from the area under examination, and reconstruction of magnetic resonance image data from the read-out magnetic resonance signals (raw data), the magnetic resonance image data depicting the area under examination.

The object under examination can be a patient, a person used for training purposes or a phantom. The area under examination is also called a recording volume or field of view (FOV). The area under examination is typically defined by a user, for example on an overview image (localizer). Alternatively or additionally, the area under examination can be defined automatically, for example on the basis of a selected protocol. The reconstructed magnetic resonance image data are provided as an output, i.e. displayed to a user on a display unit and/or stored in a database. The acquisition of the magnetic resonance image data is performed by execution of a magnetic resonance sequence by a scanner having the basic hardware described above. The magnetic resonance sequence is thus designed so that the magnetic resonance scanner can be controlled by the magnetic resonance sequence in order to carry out at least a part of the method steps according to the invention. For example, the magnetic resonance sequence can have suitable control commands that effect the irradiation of the at least one excitation pulse and/or the irradiation of the at least one inversion pulse and/or the read-out of the magnetic resonance signals.

The at least one inversion pulse typically results in a suitable preparation, in particular a deflection, of the nuclear spins in the at least one inversion pulse range. Thus, the inversion pulse can result in the preparation of the magnetization that occurs in the at least one inversion pulse range, for example longitudinal magnetization. An inversion pulse rotates the longitudinal magnetization of the nuclear spins typically by at least 150° and maximum 210°, in particular by 180°. The inversion pulse preferably has a target flip angle of 180°. Thus, the inversion pulse can effect a reversal of the magnetization, in particular the longitudinal magnetization, from positive to negative values. In this way, the magnetic resonance sequence, which includes the at least one inversion pulse, can include a short tau inversion recovery (STIR) recording method.

The at least one inversion pulse is irradiated into the at least one inversion pulse range in a data acquisition cycle of the magnetic resonance sequence, typically before the at least one excitation pulse and/or before the read-out of the magnetic resonance signals. The at least one inversion pulse is matched chronologically to the at least one excitation pulse and/or the read-out of the magnetic resonance signals such that the magnetization is suitably prepared in the at least one inversion pulse range during the irradiation of the at least one excitation pulse and/or during the read-out of the magnetic resonance signals. Typically, the inversion pulse is chronologically matched to the irradiation of the at least one excitation pulse and/or read-out of the magnetic resonance signals such that the longitudinal magnetization of the nuclear spins of a specific tissue type, preferably fat tissue, located in the at least one inversion pulse range is suppressed during the radiation of the at least one excitation pulse and/or read-out of the magnetic resonance signals. Suppression of magnetization means that the magnetization has a value of substantially zero.

The at least one inversion pulse is also typically designed tissue-specifically. This means that the at least one inversion pulse sets the magnetization only of a specific tissue type during the irradiation of the at least one excitation pulse and/or read-out of the magnetic resonance signals substantially to zero. In this case, the specific tissue type is preferably fat tissue so that the at least one inversion pulse is matched to the fat tissue located in the at least one inversion pulse range. For example, an inversion time of the at least one inversion pulse is matched to the fat tissue. In this way, the at least one inversion pulse can result in suitable suppression of fat signals emitted from the fat tissue during the read-out of the magnetic resonance signals. This can facilitate the evaluation of magnetic resonance image data by a physician. The at least one inversion pulse can also act tissue-specifically on other types of tissue, as appears advisable to those skilled in the art, for example aqueous tissue.

The at least one excitation pulse typically effects the excitation of the magnetization in the area under examination, for example by 90 degrees. In this case, the at least one excitation pulse typically ensures that a magnetic resonance signal from the area under examination can be read out.

The read-out of the magnetic resonance signals from the area under examination typically includes the setting of at least one readout window. In this case, the setting of the readout window typically includes the activation of a receiver device for the magnetic resonance signals, for example an analog-digital converter (ADC) coupled to receptive coils of the magnetic resonance scanner. The read-out of the magnetic resonance signals can also include read-out of spectroscopy signals in a magnetic resonance spectroscopy examination.

The read-out magnetic resonance signals are typically stored in a memory, so as to represent a mathematical domain called k-space. The reconstruction of the magnetic resonance image data then includes the generation of magnetic resonance images stored in the image domain from the magnetic resonance signals entered in k-space. In this case, the reconstruction of the magnetic resonance image data can be performed by techniques familiar to those skilled in the art, for example by a Fourier transformation.

The at least one inversion pulse has suitable pulse parameters so that the at least one inversion pulse range is situated at least partially outside the area under examination. The at least one inversion pulse range represents the region in which, due to the irradiation of the at least one inversion pulse, a preparation, in particular an inversion, of the magnetization takes place. The at least one inversion pulse range in particular can be a region in which the at least one inversion pulse effects a complete inversion of the nuclear spins. However, it is possible for only a substantial inversion of the nuclear spins with a flip angle different from 180 degrees to take place at the boundaries of the at least one inversion pulse range.

To ensure that the at least one inversion pulse acts site-selectively (spatially selectively) on the at least one inversion pulse range, suitable gradient switchings can be effected by the gradient coil unit of the magnetic resonance scanner during the irradiation of the at least one inversion pulse. The gradient switchings are preferably designed so that the at least one inversion pulse range is situated at least partially outside the area under examination. To this end, the at least one inversion pulse can have frequency-selective and/or phase-selective and/or slice-selective effect. The at least one inversion pulse range and the area under examination are thus at least partially spatially disjoint (non-coinciding). The at least one inversion pulse range and the area under examination can partially overlap one another in space. However, the at least one inversion pulse range will have at least one spatial section lying outside the area under examination.

Because the at least one inversion pulse range is situated at least partially outside the area under examination, the at least one inversion pulse can effect the suppression of tissue signals originating from outside the area under examination during the read-out of the magnetic resonance image data. Such tissue signals can originate, for example, from fat tissue located outside the area under examination. In this way, it is possible to at least partially prevent contamination of the magnetic resonance signals read-out with interference signals emitted from outside the area under examination.

This is advantageous because these interference signals could result in image artifacts in the magnetic resonance image data if the interference signals were not suppressed. Such interference signals also can impair the detectability of metabolites in spectroscopic magnetic resonance image data if they are not suppressed. In this case, aliasing of the interference signals in the area under examination during the read-out of magnetic resonance signals can occur due to a displaced resonance frequency of the tissue located outside the area under examination, for example when the resonance frequency of protons in fat tissue is shifted compared to the resonance frequency of protons in aqueous tissue. This phenomenon is known as chemical shift. This can result in interference signals that emanate from fat tissue located outside the area under examination also being detected during the read-out of the magnetic resonance signals, due to faulty localization. This effect can also be caused, for example, by a short longitudinal relaxation time (T1 relaxation time) of fat tissue. In specific types of imaging, such as diffusion-weighted imaging, the effect of the aliasing of the interference signals can be intensified.

The fact that the at least one inversion pulse range is arranged at least partially outside the area under examination has the further advantage that the at least one inversion pulse has a less strong influence on the magnetization in the area under examination. In this way, the at least one inversion pulse will only partially, or particularly preferably not at all, suppress the magnetization of tissue located in the area under examination. In this way, an unwanted effect of the at least one inversion pulse on the area under examination can be advantageously reduced by the site-selected application of the at least one inversion pulse can be particularly advantageous reduced and/or prevented. In this way, it is possible to improve the image quality, for example the signal-to-noise ratio of the magnetic resonance image data reconstructed from the magnetic resonance signals.

The method according to the invention has the further advantage that, due to the separate localization (spatial placement) of the at least one inversion pulse range and of the area under examination, pulse parameters of the at least one inversion pulse only have to be matched to pulse parameters of other radio-frequency-pulses in the magnetic resonance sequence to a limited degree or advantageously not at all. Such pulse parameters can be, for example, a slice profile and/or a bandwidth of the at least one inversion pulse and the radio-frequency pulse. In this way, the magnetic resonance sequence can be designed more flexibly. This also enables improved suppression of the interference signals to be achieved.

In an embodiment, an inversion time passes between the radiation of the at least one inversion pulse and the radiation of the at least one excitation pulse. This inversion time is set such that, during the radiation of the at least one excitation pulse, longitudinal magnetization of a tissue type of the object under examination located in the at least one inversion pulse range is suppressed. As explained above, the tissue type is advantageously fat tissue of the object under examination. Consequently, the inversion time is advantageously matched to the fat tissue. It is also possible for other types of tissue, for example aqueous tissue of the object under examination, to be suppressed. The fact that, during the irradiation of the at least one excitation pulse, the longitudinal magnetization of the tissue type of the object under examination is suppressed means that the longitudinal magnetization of the tissue type is substantially zero. In this way, the at least one inversion pulse and the at least one excitation pulse can be advantageously matched to one another so that the tissue type located in the at least one inversion pulse range is excited only to a restricted degree, or advantageously not at all, by the at least one excitation pulse. For example, possible aliasing of interference signals from the at least one inversion pulse range is suppressed.

In another embodiment, in addition to the at least one inversion pulse, at least one saturation pulse is radiated, wherein an inversion time passes between the radiation of the at least one inversion pulse and the radiation of the at least one saturation pulse. This inversion time is set such that, during the radiation of the at least one saturation pulse, longitudinal magnetization of a tissue type of the object under examination located in the at least one inversion pulse range is suppressed. In this case, the at least one saturation pulse is advantageously radiated within a recording cycle before the excitation pulse and/or the read-out of the magnetic resonance signals. The at least one saturation pulse can be designed, for example, as at least one fat saturation pulse and/or water saturation pulse. In this way, in addition to the inversion, saturation of a further tissue type can take place. The further tissue type, which is saturated by the at least one saturation pulse, is different from the tissue type that is suppressed by means of the at least one inversion pulse. For example, the at least one inversion pulse can suppress the magnetization of fat tissue, while the at least one saturation pulse suppresses aqueous tissue of the object under examination, or vice versa.

In another embodiment, the at least one inversion pulse range is situated completely outside the area under examination. It is conceivable for the at least one inversion pulse range to have an inversion-pulse-range boundary surface and for the area under examination to have an area-under-examination boundary surface, wherein the inversion pulse range-boundary surface at least partially coincides with the area-under-examination boundary surface. Alternatively, the at least one inversion pulse range and the area under examination be completely separate from one another. It is possible for the at least one inversion pulse range and the area under examination, for example, not to be adjacent to one another. It is also possible for a separation distance to exit between the at least one inversion pulse range and the area under examination, so that it is reliably ensured that the at least one inversion pulse is not applied to the tissue located in the area under examination. Advantageously, the at least one inversion pulse range and the area under examination can be completely spatially disjoint. This means that there is no spatial point that is simultaneously contained in the at least one inversion pulse range and in the area under examination. The complete arrangement of the at least one inversion pulse range outside the area under examination ensures that the at least one inversion pulse is not applied to the area under examination. For example, a particularly high image quality of the magnetic resonance image data, which is not impaired by at least one inversion pulse, is ensured.

In another embodiment, the at least one inversion pulse acts site-selectively on a number of inversion pulse ranges, wherein at least two inversion pulse ranges of the plurality of inversion pulse ranges are not adjacent to one another and are situated at least partially outside the area under examination. In this way, the at least one inversion pulse can suppress the magnetization of a tissue type into two spatial regions that are separate from one another. In this case, the at least two inversion pulse ranges can be assigned to different inversion pulses. Particularly advantageously, the magnetization in the at least two inversion pulse ranges can be suppressed by a single inversion pulse, as will be described below.

In an embodiment, the at least two inversion pulse ranges are arranged on two opposite sides of the area under examination. In this case, the at least two inversion pulse ranges can be arranged completely outside the area under examination and on the two opposite sides of the area under examination. However, it is also possible for the two inversion pulse ranges to protrude partially into the area under examination but nevertheless be substantially arranged on the two opposite sides of the area under examination. In two-dimensional cases, the area under examination is typically rectangular and, in three-dimensional cases, it is cuboid. The sides of the area under examination then means opposite peripheral areas of the rectangular or cuboid area under examination. The opposite sides can be arranged parallel to one another. This produces an axis standing vertically on the opposite sides. This approach is based on the consideration that the read-out of the magnetic resonance signals is typically sensitive to interference signals that are oriented in the direction of a specific axis. This embodiment thus can particularly advantageously suppress signals emanating from tissue lying on the two opposite sides.

In another embodiment, the two opposite sides of the area under examination are arranged in the direction of a phase-encoding direction. The fact that the opposite sides of the area under examination are arranged in the direction of the phase-encoding direction means that the phase-encoding direction stands vertically on the two opposite sides of the area under examination. This can advantageously achieve a suppression of interference signals in the direction of the phase-encoding direction. The phase-encoding direction in particular represents a typical spatial direction in the direction of which interference signals can be aliased. Therefore, the suppression of interference signals located in the direction of the phase-encoding direction is particularly advantageous.

In another embodiment, p the at least one inversion pulse is a single inversion pulse, which acts simultaneously on the at least two inversion pulse ranges. Particularly advantageously, the single inversion pulse can act on at least two inversion pulse ranges that are spatially separate from one another. In this case, the at least two inversion pulse ranges can be arranged in particular on the two opposite sides of the area under examination, possibly in the direction of the phase-encoding direction. The fact that the single inversion pulse acts simultaneously on the at least two inversion pulse ranges offers the advantage that the magnetization in the at least two inversion pulse ranges can be inverted simultaneously. This ensures that, at the time of the irradiation of the at least one excitation pulse or possibly of the at least one saturation pulse, there is a particularly advantageous suppression of the magnetization in the at least two inversion pulse ranges. It is possible, for example, to select a single inversion time to suppress the tissue signals in the at least two inversion pulse ranges. Thus, a particularly advantageous chronological sequence of the magnetic resonance sequence is achieved.

In another embodiment, the single inversion pulse is designed as a multi-band inversion pulse. A multi-band inversion pulse typically enables the inversion of the magnetization in a number of magnetization bands. The single inversion pulse can have, for example, at least two frequency bands. This enables the single inversion pulse particularly advantageously to act simultaneously on the at least two inversion pulse ranges.

In another embodiment, the single inversion pulse is embodied as an adiabatic multi-band inversion pulse. Adiabatic radio-frequency pulses are known, for example, from the publication of Tannus et al. "Adiabatic Pulses", NMR in Biomed, 10, 423-434 (1997). An adiabatic radio-frequency pulse is generally a pulse with amplitude modulation and frequency modulation. Instead of frequency modulation, or in addition to frequency modulation, adiabatic radio-frequency-pulse can also have phase modulation. An adiabatic pulse is usually used to prepare a common precision of all nuclear spins of an area under examination. In this case, the preparation of the nuclear spins is substantially B1-insensitive, which means that common excitation of the nuclear spins can be achieved even in the case of magnetic field inhomogeneities. If an adiabatic inversion pulse is used, the inventive approach can have only low sensitivity to B0 variations and/or B1 variations in the area under examination. This means that, compared to other methods, the inventive approach can particularly advantageously be used in the case of an inhomogeneous B0 field and/or B1 field. Such other methods, which are typically susceptible to B0 variations and/or B1 variations, can for example exhibit frequency-selective and/or site-selective saturation by saturation pulses, frequency-selective excitation, a polarity-sensitive and/or bandwidth sensitive slice selection.

The magnetic resonance apparatus according to the invention has an inversion pulse unit, an excitation pulse unit, a readout unit and a reconstruction unit, and the magnetic resonance device is designed to carry out a method as described in any of the preceding embodiments.

The magnetic resonance apparatus is thus designed to implement the method for acquiring magnetic resonance image data from an area under examination of an examination object. The inversion pulse unit is configured for the radiation of at least one inversion pulse, which acts site-selectively on at least one inversion pulse range, with the at least one inversion pulse range situated at least partially outside the area under examination. The excitation pulse unit is configured for the radiation of at least one excitation pulse. The readout unit is configured to read out magnetic resonance signals from the area under examination. The reconstruction processor is configured for the reconstruction of magnetic resonance image data from the read-out magnetic resonance signals, with the magnetic resonance image data depicting the area under examination.

A non-transitory, computer-readable data storage medium according to the invention can be loaded directly into a memory of a programmable computer of a magnetic resonance apparatus and is encoded with program-code that causes the method according to the invention to be implemented when the program code is executed in the computer of the magnetic resonance apparatus. This enables the method according to the invention to be carried out quickly, in an identically repeatable manner, and robustly. The computer must satisfy the requirements for carrying out the respective method steps efficiently, for example by having a working memory, a graphics card, or a logic board. Examples of the electronically readable data carrier are a DVD, a magnetic tape or a USB stick on which electronically readable control information is stored.

The advantages of the magnetic resonance apparatus according to the invention and the storage medium according to the invention substantially correspond to the advantages of the method according to the invention, which were explained in detail above. Advantages and alternative embodiments mentioned here are applicable to the other aspects of the invention as well. The functional features of the method are achieved by corresponding object modules, in particular by hardware modules.

DESCRIPTION OF THE PREFERRED EMBODIMENTS

Figure 1:
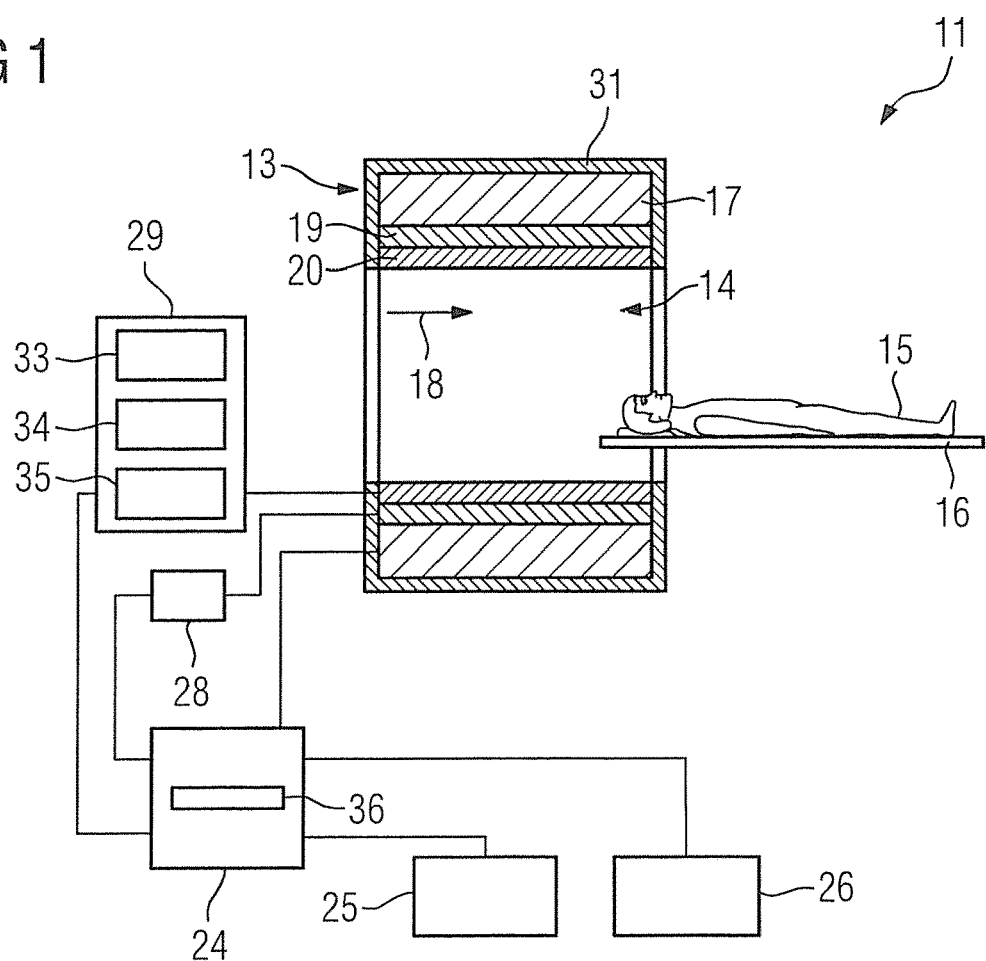
FIG. 1 schematically illustrates magnetic resonance apparatus according to the invention.

FIG. 1 schematically shows a magnetic resonance apparatus according to the invention. The magnetic resonance apparatus 11 has a detector unit formed by a scanner 13 with a basic magnet 17 that generates a strong and constant basic magnetic field 18. The magnetic resonance scanner 13 also has a cylindrical patient-receiving region 14 to receive an object under examination 15, in the present case a patient (or "subject," as referenced herein), wherein the patient-receiving region 14 is cylindrically enclosed by the scanner 13 in the circumferential direction. The patient 15 can be moved into the patient-receiving region 14 by a patient support 16 of the magnetic resonance scanner 13. To this end, the patient support 16 has a support table arranged movably inside the magnetic resonance scanner 13. The scanner 13 is shielded from the outside by a housing shell 31.

The scanner 13 further has a gradient coil arrangement 19 for generating magnetic field gradients that are used for spatial encoding during imaging. The gradient coil arrangement 19 is controlled by a gradient control processor 28. The scanner 13 also has a radio-frequency antenna 20, which, in the case shown, is embodied as a body coil permanently integrated in the magnetic resonance scanner 13, and a radio-frequency antenna control processor 29 in order to excite nuclear spins in the patient 15 so as to deviate from the polarization that is established in the basic magnetic field 18 generated by the basic magnet 17. The radio-frequency antenna 20 is controlled by the radio-frequency antenna control processor 29 and radiates radio-frequency pulses into an examination chamber substantially formed by the patient-receiving region 14. The radio-frequency antenna unit 20 is further embodied to receive magnetic resonance signals from the patient 15.

To control the basic magnet 17, the gradient control processor 28 and the radio-frequency antenna control processor 29, the magnetic resonance apparatus 11 has a control computer 24. The control computer 24 controls the magnetic resonance apparatus 11 centrally, such as, for example, for the performance of a predetermined imaging gradient echo sequence. Control information such as, for example, imaging parameters, and reconstructed magnetic resonance images can be provided to a user on an output interface 25, in the present case a display monitor. The magnetic resonance apparatus 11 also has an input interface 26 via which a user can enter information and/or parameters during a data acquisition process. The control computer 24 can include the gradient control processor 28 and/or radio-frequency antenna control processor 29 and/or the output interface 25 and/or the input interface 26.

The radio-frequency antenna control processor 29 has an inversion pulse stage 33. The inversion pulse stage 33 is configured to control the radio-frequency antenna 20. Dependent on the control by the inversion pulse stage 33, the radio-frequency antenna 20 can radiate inversion pulses, for example, saturation pulses, into the object under examination 15.

The radio-frequency antenna control processor 29 further has an excitation pulse unit 34. The excitation pulse stage 34 is configured to control the radio-frequency antenna 20. Dependent on the control by the inversion pulse stage 34, the radio-frequency antenna unit 20 radiates excitation pulses into the object under examination 15.

The radio-frequency antenna control processor 29 further has a readout stage 35. The readout stage 35 is configured to read out magnetic resonance signals from the area under examination. The readout stage 35 can alternatively or additionally be integrated in a local radio-frequency antenna unit, for example a local coil.

In the case shown, the control computer 24 has a reconstruction processor 36. The reconstruction processor 36 is configured for the reconstruction of magnetic resonance image data from the read-out magnetic resonance signals. To this end, the reconstruction processor 36 is connected to the readout stage 35 in particular with respect to data exchange.

Figure 2:
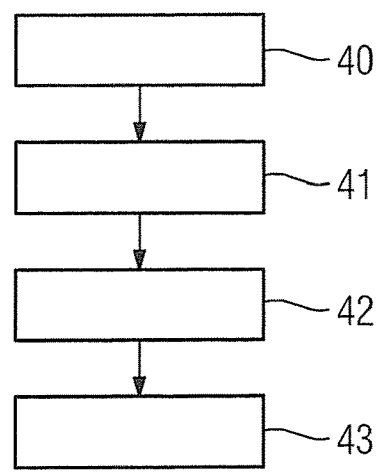
FIG. 2 is a flowchart of an embodiment of a method according to the invention.
Figure 3:
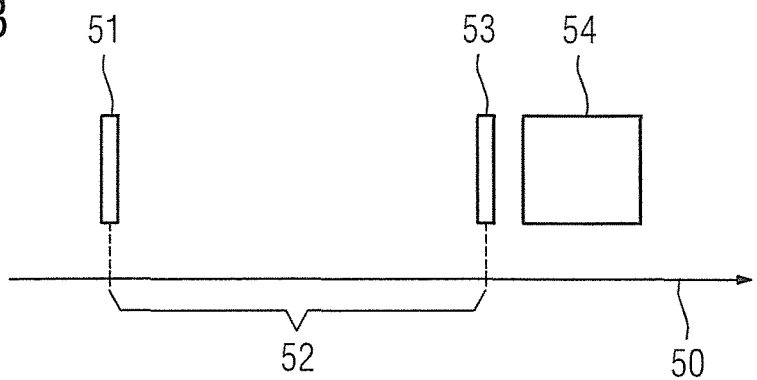
FIG. 3 is a flowchart of a first embodiment of a magnetic resonance sequence for implementing the method according to the invention.

Thus the magnetic resonance apparatus 11 shown is designed to implement a method for acquiring magnetic resonance image data from an area under examination of an object under examination 15, such as, for example, shown in FIGS. 2-3.

The magnetic resonance apparatus 11 shown can obviously include further components that are normally present in magnetic resonance apparatuses. Moreover, the general operation of a magnetic resonance apparatus is known to those skilled in the art, so a detailed description of the further components is not necessary herein.

FIG. 2 is a flowchart of an embodiment of a method according to the invention for acquiring magnetic resonance image data from an area under examination of an object under examination 15.

Figure 5:
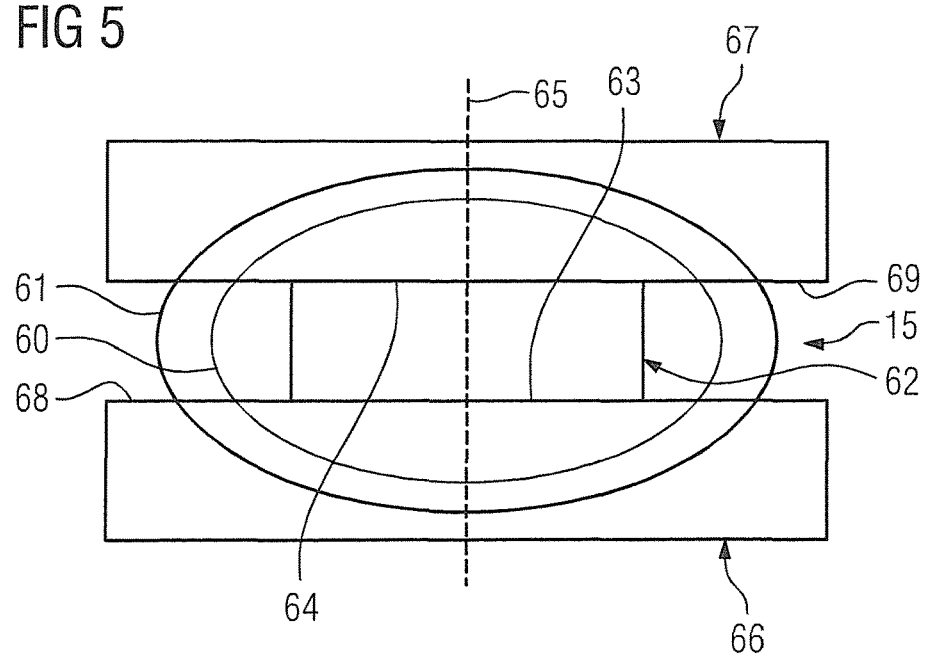
FIG. 5 shows an exemplary spatial arrangement of two inversion pulse ranges and an area under examination.

In a first method step 40, at least one inversion pulse is irradiated by means of the inversion pulse stage 33, wherein the at least one inversion pulse acts site-selectively on at least one inversion pulse range, wherein the at least one inversion pulse range is arranged at least partially outside the area under examination. As shown in FIG. 5, in this case, the at least one inversion pulse, in particular a single inversion pulse, can act site-selectively on a plurality of inversion pulse ranges. If a single inversion pulse acts on the plurality of inversion pulse ranges, the single inversion pulse is advantageously embodied as a multi-band inversion pulse, extremely advantageously as an adiabatic multi-band inversion pulse. Obviously, it is also conceivable for the at least one inversion pulse to act on a single inversion pulse range.

In a further method step 41, the at least one excitation pulse is irradiated by means of the excitation pulse unit 34. In this case, the at least one excitation pulse is in particular irradiated in chronological coordination with the at least one inversion pulse (see FIG. 3). In a further method step 42, magnetic resonance signals are read out from the area under examination by means of the readout unit 35. The magnetic resonance signals are in particular read out by nuclear spins, which were excited by means of the at least one excitation pulse. In a further method step 43, magnetic resonance image data is reconstructed from the read-out magnetic resonance signals by means of the reconstruction processor 36, wherein the magnetic resonance image data depicts the area under examination.

FIG. 2 shows the method steps 40, 41, 42, 43 in a consecutive sequence. However, the method steps 40, 41, 42, 43 do not mandatorily have to be chronologically directly successive. In particular, in the method steps 40, 41, 42 shown, the irradiation of the at least one inversion pulse and the at least one excitation pulse and the read-out of the magnetic resonance signals can be performed in one recording cycle of a magnetic resonance sequence. The magnetic resonance sequence can include a number of recording cycles in which the method steps 40, 41, 42 are performed repeatedly. It is also conceivable for the reconstruction of the magnetic resonance image data to be performed in the further method step 43 in the recording cycle. Alternatively, the further method step 43 can also performed following the conclusion of the read-out of all magnetic resonance signals.

The method steps of the method according to the invention shown in FIG. 2 are carried out by the computing unit. To this end, the computing unit comprises the necessary software and/or computer programs, which are stored in a memory unit of the computing unit. The software and/or computer programs comprise program means designed to carry out the method according to the invention when the computer program and/or software is executed in the computing unit by a processor of the computing unit.

FIG. 3 shows a flowchart of a first embodiment of a magnetic resonance sequence, which carries out a method according to the invention. In this case, the magnetic resonance sequence shown is only a schematic sketch, wherein this is limited to elements of the magnetic resonance sequence that are essential for the invention. In particular, FIG. 3 is a schematic illustration of a recording cycle of the magnetic resonance sequence. In this way, the magnetic resonance sequence provides repeated production of the sequence elements shown in FIG. 3. However, FIG. 3 here shows the chronological sequence of the recording cycle, wherein the sequence elements are arranged over a time axis 50.

The recording cycle of the magnetic resonance sequence shown comprises an inversion pulse 51, an excitation pulse 53 and a read-out window 54 during which magnetic resonance signals are read out. Here, the read-out window 54 follows the excitation pulse 53 so that the magnetic resonance signals can be read out by nuclear spins excited by means of the excitation pulse 53. Obviously, it is conceivable for the recording cycle in each case to include a larger number of inversion pulses 51, excitation pulses 53 and read-out windows 54 than those shown.

Between the radiation of the at least one inversion pulse 51, and the radiation of the at least one excitation pulse 53, in the case shown, an inversion time 52 passes. The inversion time 52 is advantageously selected such that, during the irradiation of the excitation pulse 53, longitudinal magnetization of a tissue type of the object under examination in the at least one inversion pulse range of the inversion pulse 51 is suppressed.

Figure 4:
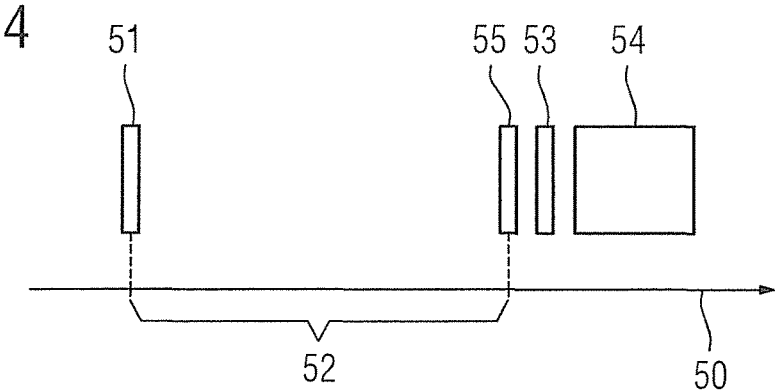
FIG. 4 is a flowchart of a second embodiment of a magnetic resonance sequence for implementing the method according to the invention.

FIG. 4 shows a flowchart of a second embodiment of a magnetic resonance sequence, which carries out a method according to the invention. The following description is substantially restricted to the differences from the exemplary embodiment in FIG. 3, wherein reference is made to the description of the exemplary embodiment in FIG. 3 with respect to elements that remain the same. Elements that substantially remain the same are generally given the same reference numbers.

Additionally to FIG. 3, the recording cycle shown comprises a saturation pulse 55. The recording cycle can also include a plurality of saturation pulses 55. Alternatively to FIG. 3, said inversion time 52 passes between the irradiation of the inversion pulse 51 and the irradiation of the saturation pulse 55. In the case shown in FIG. 4, the inversion time is selected such that, during the irradiation of the saturation pulse 55, longitudinal magnetization of a tissue type of the object under examination 15 located in the at least one inversion pulse range of the inversion pulse 51 is suppressed. The saturation pulse 55 can advantageously suppress the tissue signals of a different tissue type than those suppressed by the inversion pulse 51.

FIG. 5 shows an exemplary spatial arrangement of two inversion pulse ranges 66, 67 and an area under examination 62. Reference is made to the fact that FIG. 5 only depicts a possible spatial arrangement. On the basis of the subject matter of the invention, the person skilled in the art can derive different spatial arrangements of the inversion pulse ranges 66, 67 and the area under examination 62 from those shown in FIG. 5.

FIG. 5 shows an axial slice of the object under examination 15. In the case shown, the axial slice is arranged in an abdominal region of the object under examination 15. In the case shown, the slice of the object under examination 15 shown comprises a first tissue type 60 and a second tissue type 61. In this case, the second tissue type 61 is arranged in a belt around the first tissue type 60. Here, as an example, the first tissue type 60 includes tissue of the object under examination 15 with a high water concentration, in particular aqueous tissue, and the second tissue type 61 a tissue type of the object under examination 15 with a high fat concentration, in particular fat tissue.

In the case shown, magnetic resonance image data to be acquired for the first tissue type 60, the aqueous tissue. The magnetic resonance image data is to be acquired by a magnetic resonance sequence from an area under examination 62. In the case shown, the area under examination 62 is arranged within the areas in which the first tissue type 60, the aqueous tissue, is present. A two-dimensional slice of the area under examination 62 is shown in FIG. 5. The area under examination 62 can overall be embodied three-dimensionally, wherein then further slices of the area under examination 62 are present in other body areas of the object under examination 15. Alternatively, the area under examination 62 can be restricted to the two-dimensional slice shown in FIG. 5.

In this case, the area under examination 62 was in particular defined by a user, for example by means of the input unit 26 of the magnetic resonance apparatus 11. The area under examination 62 shown comprises a first boundary side 63 and a second boundary side 64, wherein the first boundary side 63 is arranged opposite the second boundary side 64. An axis 65 is aligned vertically on the first boundary side 63 and the second boundary side 64. The axis 65 can be aligned in the direction of a phase-encoding direction of the magnetic resonance sequence by means of which the magnetic resonance image data is recorded.

To record the magnetic resonance image data 62, it is necessary to suppress disruptive fat signals from outside the area under examination 62. This in particular relates to fat signals from the second tissue type 61, the fat tissue, which are arranged in the direction of the axis 65, in particular in the direction of the phase-encoding direction, on two opposite boundary sides 63, 64 of the area under examination 62.

Accordingly, to record the magnetic resonance image data, the magnetic resonance sequence comprises at least one inversion pulse. In the case shown in FIG. 5, the at least one inversion pulse acts site-selectively on two inversion pulse ranges 66, 67. In the case shown, the two inversion pulse ranges 66, 67 are arranged completely outside the area under examination 62. Furthermore, in the case shown, the two inversion pulse ranges 66, 67 are not adjacent to one another.

Instead, in the case shown, the area under examination 62 lies between the two inversion pulse ranges 66, 67. Hence, the inversion pulse ranges 66, 67 are arranged on the two opposite boundary sides 63, 64 of the area under examination 62. Thus, in the case shown, a first inversion pulse range 66 of the two inversion pulse ranges 66, 67 has a first interface 68, which is directly adjacent to the first boundary side 63 of the area under examination 62. Consequently, a second inversion pulse range 67 of the two inversion pulse ranges 66, 67 comprises a second interface 69, which is directly adjacent to the second boundary side 64 of the area under examination 62.

Obviously, the boundary sides 63, 64 of the area under examination 62 do not have to be directly adjacent to the interfaces 68, 69 of the inversion pulse ranges 66, 67. Alternatively to the case shown in FIG. 5, it is also possible for an intermediate space to be provided between the boundary sides 63, 64 and the interfaces 68, 69. Alternatively, the area under examination 62 and the inversion pulse ranges 66, 67 can also partially overlap each other.

Particularly advantageously, a single inversion pulse acts simultaneously on the two inversion pulse ranges 66, 67. To this end, this single inversion pulse can advantageously be embodied as an adiabatic, multi-band inversion pulse. This can ensure simultaneous suppression of the fat signals from the two inversion pulse ranges 66, 67.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a magnetic resonance (MR) image from an examination area of a subject that is larger than the examination area, comprising:

in a control computer generating operating signals for a radio-frequency (RF) coil and a gradient coil arrangement of an MR scanner, and providing said operating signals from said control computer to said RF coil so as to cause said RF coil, while the subject is situated in the MR scanner, to radiate a single inversion pulse that simultaneously acts site-selectively on at least two inversion pulse ranges in said subject that are each smaller than said subject, with said at least two inversion pulse ranges not being adjacent to each other and each being situated at least partially outside of said examination area of the subject;

also with said operating signals, operating the RF coil of the MR scanner while the subject is situated in the MR scanner, so as to radiate at least one excitation pulse that causes MR signals to originate within said subject;

also with said operating signals, operating said gradient coil arrangement of the MR scanner, while the subject is situated therein, so as to read out said MR signals from said examination area, with an influence of said MR signal from said examination area, produced from said inversion pulse ranges in said subject, being reduced due to said single inversion pulse acting simultaneously on said inversion pulse ranges in said subject; and providing said MR signals to a reconstruction computer and, in said reconstruction computer, reconstructing MR image data from the MR signals that were read out from said examination area, said MR image data depicting said examination area, and making said MR image data available from the computer in electronic form as a data file.

2. A method as claimed in claim 1 comprising operating said MR scanner to radiate said at least one inversion pulse and to radiate said at least one excitation pulse with an inversion time therebetween that has a duration selected to suppress, during the radiation of the at least one excitation pulse, longitudinal magnetization of a selected tissue type that is situated in said at least one inversion pulse range.

3. A method as claimed in claim 2 comprising operating said MR scanner, while the subject is situated therein, to radiate at least one saturation pulse following the radiation of said at least one inversion pulse, with a time between radiation of said at least one inversion pulse and radiation of said at least one saturation pulse being selected to cause, during radiation of said at least one saturation pulse, longitudinal magnetization of a selected tissue type to be suppressed in said at least one inversion pulse range.

4. A method as claimed in claim 1 comprising operating said RF coil of the MR scanner to radiate said at least inversion pulse with said at least one inversion pulse range being situated completely outside of said examination area.

5. A method as claimed in claim 1 comprising operating said RF coil of the MR scanner to radiate said at least one inversion pulse to cause said at least two inversion pulse ranges to be situated in said subject respectively on opposite sides of said examination area.

6. A method as claimed in claim 5 comprising operating said MR scanner to phase encode said MR signals in a phase-encoding direction, and operating said RF coil of the MR scanner to radiate said at least one inversion pulse to cause said two opposite sides of said examination area in said subject to be parallel to said phase-encoding direction.

7. A method as claimed in claim 1 comprising operating said RF coil of the MR scanner to radiate said single inversion pulse as a multi-band inversion pulse.

8. A method as claimed in claim 7 comprising operating said MR scanner to radiate said single inversion pulse as an adiabatic multi-band inversion pulse.

9. A method as claimed in claim 1 wherein said examination area of said subject is a slice of said subject.

10. A magnetic resonance (MR) apparatus for obtaining an MR image for an examination area of subject that is larger than the examination area, said MR apparatus comprising:

an MR scanner comprising a radio-frequency (RF) coil and a gradient coil arrangement;

a control computer configured to generate operating signals for said RF coil and said gradient coil arrangement and to provide said operating signals to said RF coil so as to operate the RF coil, while the subject is situated in the MR scanner, to radiate a single inversion pulse that simultaneously acts site-selectively on at least two inversion pulse ranges in said subject that are each smaller than said subject, with said at least two inversion pulse ranges not being adjacent to each other and each being situated at least partially outside of said examination area of the subject;

said control computer being configured, also with said operating signals, to operate the RF coil of the MR scanner, while the subject is situated in the MR scanner, to radiate at least one excitation pulse that causes MR signals to originate within said subject;

said control computer being configured, also with said operating signals, to operate said gradient coil arrangement of the MR scanner, while the subject is situated therein, to read out said MR signals from said examination area, with an influence of said MR signal from said examination area, produced from said inversion pulse ranges in said subject, being reduced due to said single inversion pulse acting simultaneously on said inversion pulse ranges in said subject; and a reconstruction processor provided with said MR signals, said reconstruction processor being configured to reconstruct MR image data from the MR signals that were read out from said examination area, said MR image data depicting said examination area, and to make said MR image data available from the reconstruction processor in electronic form as a data file.

11. An MR apparatus as claimed in claim 10 wherein said examination area of said subject is a slice of said subject.

12. A non-transitory, computer-readable data storage medium encoded with programming instructions, said storage medium being loaded into a control and reconstruction computer of a magnetic resonance (MR) apparatus for obtaining an MR image for an examination area of a subject that is larger than the examination area, comprising an MR scanner having a radio-frequency (RF) coil and a gradient coil arrangement, said programming instructions causing said control computer to:

generate operating signals for said RF coil and said gradient coil arrangement and to provide said operating signals to said RF coil so as to operate the RF coil of the MR scanner with said operating signals, while the subject is situated in the MR scanner, so as to radiate a single inversion pulse that simultaneously acts site-selectively on at least two inversion pulse ranges in said subject that are each smaller than said subject, with said at least two inversion pulse ranges not being adjacent to each other and each being situated at least partially outside of said examination area of the subject;

also with said operating signals, operate the RF coil of the MR scanner, while the the subject is situated in the MR scanner, to radiate at least one excitation pulse that causes MR signals to originate within said subject;

also with said operating signals, operate said gradient coil arrangement of the MR scanner, while the subject is situated therein, to read out said MR signals from said examination area, within an influence on said MR signals from said examination area, produced from said inversion pulse ranges in said subject being reduced due to said single inversion pulse acting site-selectively on said inversion pulse ranges in said subject; and reconstruct MR image data from the MR signals that were read out from said examination area, said MR image data depicting said examination area, and make said MR image data available from the control and reconstruction computer in electronic form as a data file.

13. A non-transitory, computer-readable data storage medium as claimed in claim 12 wherein said examination area of said subject is a slice of said subject.

* * * * *